United States Statutory Invention Registration [19]

[11] Reg. Number: H353

Taylor [43] Published: Oct. 6, 1987

[54] EXTENDED PRECISION IN VIDEO BANDWIDTH ANALOG TO DIGITAL CONVERTER USING OPTICAL TECHNIQUES

[75] Inventor: Henry F. Taylor, Alexandria, Va.

[73] Assignee: The United States of America, Washington, D.C.

[21] Appl. No.: 717,365

[22] Filed: Mar. 28, 1985

[51] Int. Cl.[4] ..... H03M 1/34

[52] U.S. Cl. ..... 340/347 AD; 340/347 M; 350/96.14

[58] Field of Search ..... 340/347 AD, 347 M, 347 P; 250/231 SE; 350/96.14

[56] References Cited

U.S. PATENT DOCUMENTS

| | | | |
|---|---|---|---|
| 3,641,564 | 2/1972 | Fasset et al. | 340/347 AD |
| 4,058,722 | 11/1977 | Taylor | 250/225 |
| 4,346,447 | 8/1982 | Takahama | 364/560 |

OTHER PUBLICATIONS

Henry F. Taylor, "Extended Precision in Video Bandwidth Analogue/Digital Converters Using Optical Techniques", Electronic Letters, 12 Apr. 1984, vol. 20, No. 8, pp. 352-353.

"Gate Array Design," Toshiba publication GA--E-S107, Aug. '86, pp. 1-2, 1-3, 2-2, 2-4, & 2-18.

Leonburger, High-Speed Electro-Optical Signal Conversion Devices, Proceedings Society Photo-Opt. Instrum. Engg. (U.S.A), pp. 41-46, SPIE vol. 218 Devices and Systems for Optical Signal Processing (1980).

Leonburger et al, 4-Bit 828-Megasample/s Electro-Optic Guided-Wave . . . , Appl. Phys. Lett. 40(7), 1 Apr. 1982, pp. 565-658.

*Primary Examiner*—Stephen C. Buczinski
*Assistant Examiner*—Linda J. Wallace
*Attorney, Agent, or Firm*—John L. Forrest; Sol Sheinbein

[57] ABSTRACT

Two interferometric electro-optic modulators formed from single mode waveguides in a single crystal substrate of pockels (linear) electro-optic material is used in conjunction with optical sampling techniques and conventional Analog-to-Digital technology to convert analog signals to a binary representation.

16 Claims, 5 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

EXTENDED PRECISION IN VIDEO BANDWIDTH ANALOG TO DIGITAL CONVERTER USING OPTICAL TECHNIQUES

BACKGROUND OF THE INVENTION

The present invention relates to analog-to-digital converters and specifically to an extended precision in video-bandwidth analog-to-digital converter using optical techniques. The invention also relates to the particular configuration of such an analog-to-digital converter.

The function of an analog-to-digital converter (ADC) is to repetitively sample a time-varying waveform, usually at fixed time intervals, and generate a series of digital numbers to approximate the analog sample values.

Analog-to-digital converters (ADCs) are widely used to translate sensor measurements of an analog nature into the digital language of computing, information processing, and control systems. There is presently considerable interest in high-precision (8–10 bit) conversion at rates of 10–20 Msamples/sec for use in digital transmission and recording of television signals. However, for some applications (e.g., in radar signal processing), even higher precision at video sampling rates is desired for enhanced dynamic range. It has proven difficult to achieve precision beyond 10 bits at these rates using conventional silicon integrated circuit technology.

Previous optical ADC designs have made use of the periodic dependence of the transmission of an interferometric electro-optic modulator on applied voltage. Operation at rates greater than 100 Msamples/sec has been demonstrated in several laboratories, and recently 1 Gsample/sec performance was reported at Lincoln Laboratory. In those experiments, electronic comparators converted the optical signals from an array of N modulators into an N-bit binary word.

OBJECTS OF THE INVENTION

An object of the invention is to convert analog signals to digital form with increased precision as compared with conventional analog-to-digital converters (ADCs).

A further object of the invention is to provide short, low-jitter sampling time apertures while greatly relaxing the drift requirement on the sample-and-hold circuit.

It is a further object of the invention to provide an analog-to-digital converter wherein N bits of precision may be obtained with two modulators.

Other objects, advantages, and novel features of the present invention will become apparent from the detailed description of the invention, which follows the summary.

SUMMARY OF THE INVENTION

Briefly, the present invention is a device for converting an analog voltage signal to digital form with higher precision than can otherwise be obtained. This device comprises an optical conversion unit, for expanding the dynamic range of the input signal and providing optical sampling for improving sampling time stability; LSB means for detecting, digitizing and processing the optical modulator signal outputs to form a least significant bits LSB representation; MSB means for digitizing the input analog signal to form a most significant bits MSB representation; and means for interleaving the LSB representation and the MSB representation to form a final binary representation of the input analog signal.

In a preferred embodiment, the optical conversion unit of the present invention may comprise two interferometric optical intensity modulators. Each modulator has outputs exhibiting operative characteristics based on a linear electro-optic phase retardation varying in periodic fashion as a function of an applied electric field. The electric field is derived from the analog input voltage that it is desired to convert to digital form. Likewise, in a preferred embodiment, the detecting, digitizing, and processing means may comprise photo detectors connected serially to the outputs of the optical intensity modulators. Each photodiode is capable of detecting and transferring the transmitted power output of the optical modulators. The photo detectors transmit the analog modulator outputs to electronic analog-to-digital converters (ADCs). At this stage, the ADCs convert the analog value to digital form. In this embodiment further processing would comprise means for comparing the digital power levels from the ADCs and for selecting the most sensitive value for conversion to voltage as the least significant bit LSB. Conversion tables stored in electronic read only memories (ROMs) are used for this step.

The most significant bits representation MSB may be determined by an electronic analog-to-digital converter fed directly from the input voltage V(t).

Interleaving logic accepts the LSB and MSB values, compares the two and incremently increases the LSB until a representation of the input analog signal is deemed most accurate obtained.

DESCRIPTION OF THE PREFERRED EMBODIMENT

Figure 1:
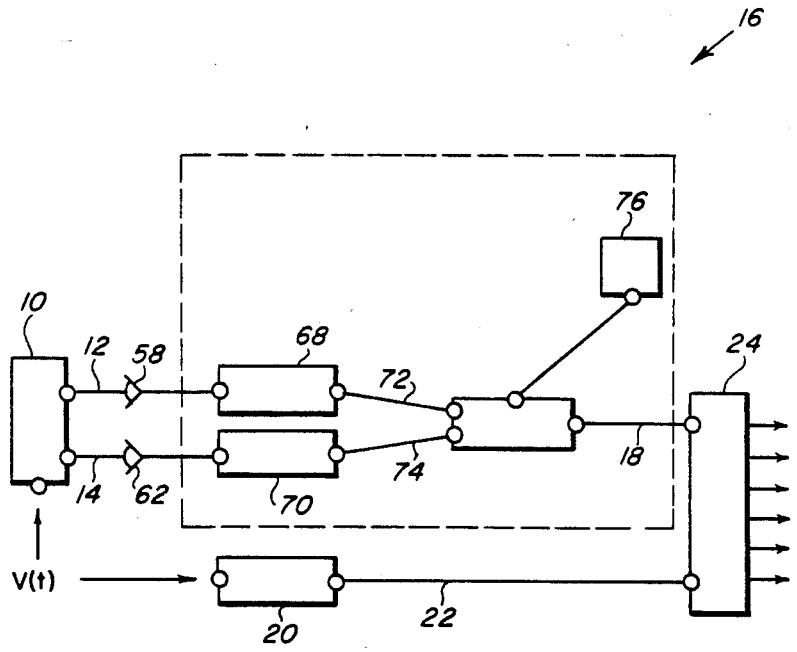
FIG. 1 is a block diagram of one embodiment of the optic analog-to-digital converter of the present invention.

Referring now to the drawings, wherein like reference numerals designate identical or corresponding parts throughout the several views, and more particularly to FIG. 1, thereof, the extended precision in Video Bandwidth analog-to-digital converter using optical techniques includes an optical conversion unit 10 wherein an input analog time varying signal V(t) is optically sampled. The transmitted power outputs 12 and 14 of the optical conversion unit are detected by photodetectors 58, 62 and then digitized and processed by the digitizing and processing means 16 to obtain the desired least significant bit LSB representation shown on line 18. A second digitizing means 20 is provided to form the most significant bit MSB representation of the input analog time varying signal V(t) on line 22. The least significant bit LSB in the binary code is defined as the bit which changes in value the most rapidly as V(t) changes; the most significant bit (MSB) changes least rapidly with variations in V(t). An interleaving logic means 24 is provided to interleave the LSB value on line 18 and the MSB value on line 22 to form a final binary representation of the input analog signal V(t).

Figure 2:
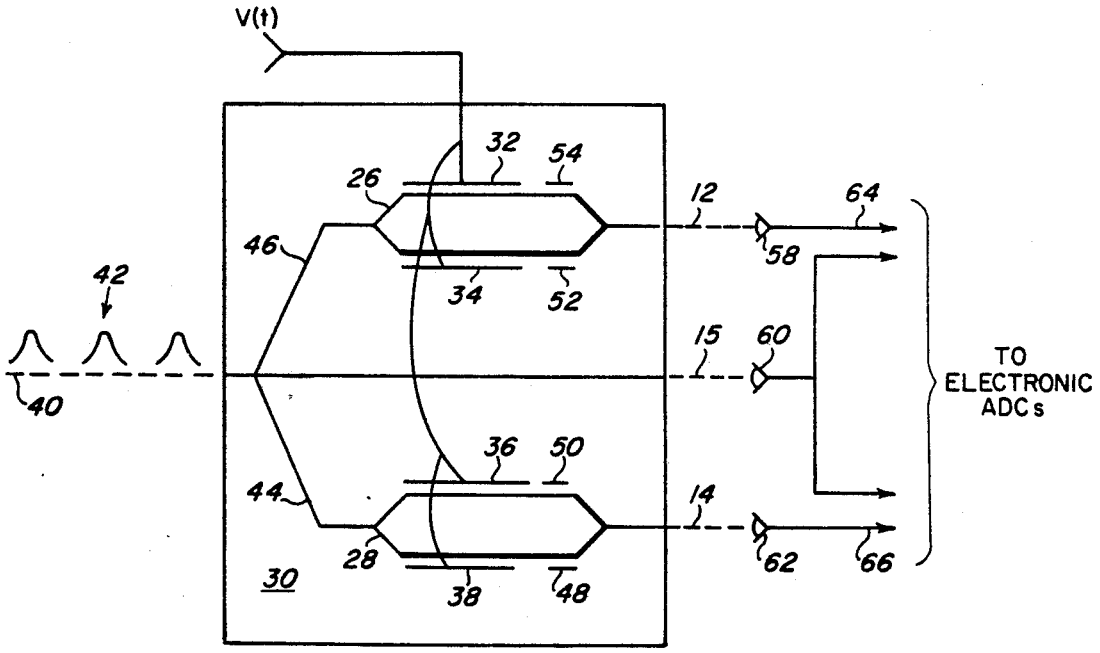
FIG. 2 is a block diagram of an optical conversion unit for the present invention.

While the optical conversion unit 10 may take a variety of forms, it may conveniently take the form shown in FIG. 2 of two interferometric electro-optic modulators 26 and 28 fabricated on a single crystal substrate 30 of a Pockels (linear) electro-optic material. Such as lithium tantalate or lithium niobate for example. A time-varying signal voltage V(t), the analog quantity to be converted to digital form, is applied in parallel to the signal electrodes 32, 34, 36, and 38 on each modulator. A train of short optical pulses 40 is used to sample the transmission of both modulators simultaneously with, for example, a mode locked-laser.

The use of a mode-locked laser as the source would provide a unique means of signal sampling for the disclosed optical AD converter. This type of laser generates a train of light pulses which are coupled into the modulator array. Coupling may be achieved, for example, by means of lenses or optical fibers or the light source could be placed in close proximity to the substrate 30 for direct butt coupling into the waveguide substrate 30. The intensity of the pulse transmitted by a particular modulator is determined by an average of the voltage on the signal electrodes 32, 34, 36, and 38 during the time the pulse is present. Signal sampling with optical pulses could eliminate the need for a sample-and-hold circuit, a performance limiting component in conventional high speed AD converters.

Clock and sample-and-hold circuits are also sources of equipment-related errors in conventional ADCs. The pulsed light source, which performs the equivalent functions in the optical ADCs, is equally a source of error in addition to quantization and receiver noise errors. However, if pulse stability is high, the overall error in the present optical device is less than in conventional ADCs. Stability on a pulse-to-pulse basis of the sampling time interval and of the pulse energy are two important characteristics which relate to the error of the device. A third is the duration of the electro-optic interaction, which is determined by both the width of the optical pulse and the optical transit time for the modulators 26 and 28. However, the electrooptic modulators 26 and 28 expand the dynamic range of the input signal V(t) reducing the need for ideal pulse characteristics.

The feature of this type of modulator which makes it usable for analog-to-digital conversion is the periodic dependence of the output intensity on the applied voltage. This dependence is described by H. F. Taylor et al. in "Electro-optic analog-to-digital conversion using channel waveguide modulators", Appl. Phys. Lett., Vol. 32, pp. 559–561, 1 May 1978, whose disclosure is hereby incorporated by reference.

As shown in FIG. 2, modulators 26 and 28 are assumed to be identical except for a relative phase bias $\theta$. The phase bias $\theta$ is induced to obtain a second set of characteristic curves of the power voltage relationship as depicted in FIG. 3.

Figure 3:
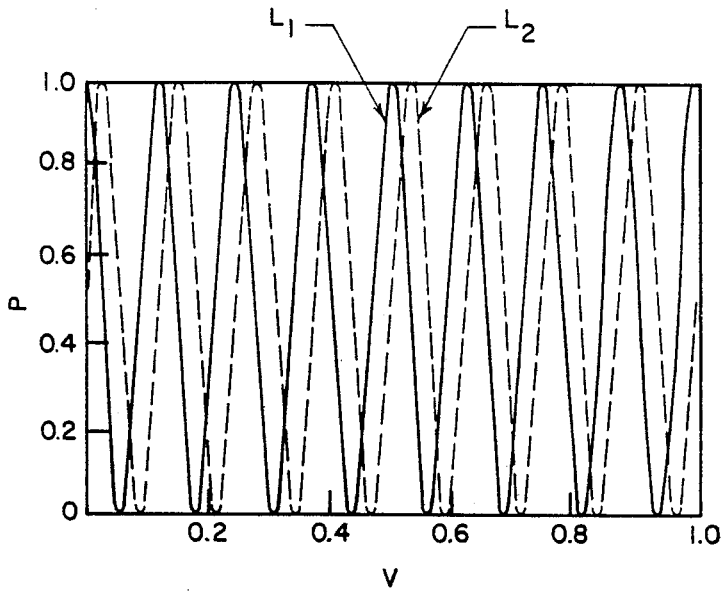
FIG. 3 is a graphical representation of the dependence of optical output power on applied voltage for two modulators in one embodiment of the present invention as illustrated in FIG. 2 and as calculated from Equation 1.
Figure 4A:
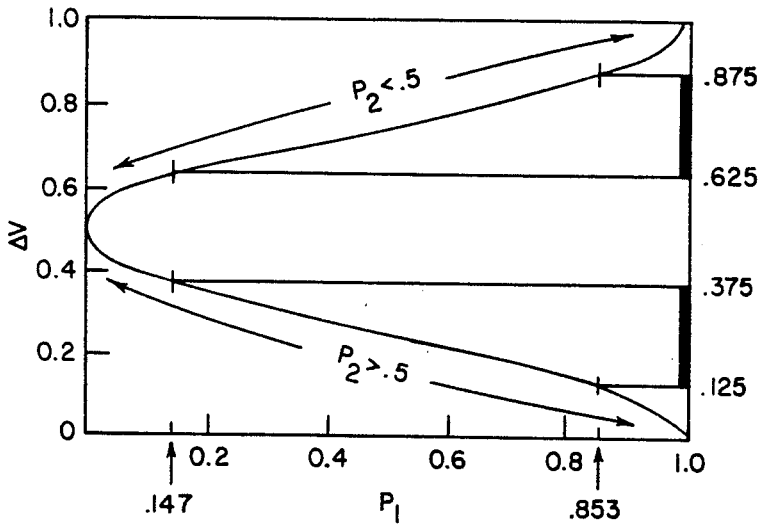
FIGS. 4*a* and 4*b* are graphical representations of modulator output-power to voltage relationship for each modulator of the embodiments of FIGS. 2 and 3.
Figure 4B:
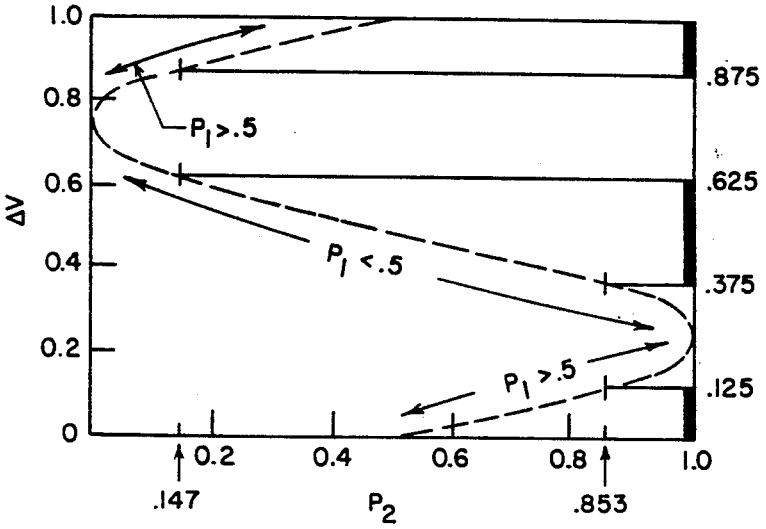

The power outputs 12 and 14 transmitted through the modulators 26 and 28 are predicted to vary according to the equation $$P=0.5[1+\cos(2^m\pi V+\theta)] \quad (1)$$

where the maximum optical power and voltage range are normalized to unity, FIGS. 3, 4a, 4b, and m is a parameter specific to the modulator design which determines the periodicity of the power output as a function of voltage. FIG. 3 is a plot of characteristic curves for two such modulators for the case that m=4, with $\theta 0$ for modulator 26 and $\theta=-\pi/2$ for modulator 28. In practice, this phase bias could be produced by designing the modulators 26 and 28 such that the physical path-length difference of a waveguide 44 or 46 is a quarter wavelength, by providing an overlay film on a section of waveguide 44 or 46 to increase the effective guided-mode refractive index, or by applying a voltage to DC bias electrodes 48 and 50 or 52 and 54.

It is evident from an examination of FIG. 3 that a knowledge of the output power from the two modulators 26 and 28 makes it possible to uniquely determine the value of V within a range $\Delta_m$. Where $\Delta_m$ is the effective width of a modulator period. In this case, $$\Delta_m=\tfrac{1}{8} \text{ and in general } \Delta_m=2^{1-m}.$$

The photodetection may be accomplished by photodiodes 58, 60, and 62 detecting the modulator output signals 12, and 14 as well as an unmodulated strobe signal 15. For this embodiment, RCA Model C30902E avalanche photodiode is suggested.

Referring again to FIG. 1, the detected signals 64 and 66 are digitized by a digitizing means 16 which includes a first electronic analog-to-digital converter chip 68 serially connected to detected modulator output 64 and a second analog-to-digital converter chip 70 serially connected to detected modulator output 66.

After detected modulator power outputs 64 and 66 are converted to digital form by electronic analog-to-digital converters 68 and 70 the digitizing means 16 further includes translating the digital modulator output, lines 72 and 74, into digital least significant bit LSB voltage values using conversion tables stored in an electronic read-only memory (ROM) 76 to reproduce in digital form the scheme described above and illustrated in FIG. 4.

The equivalent of FIG. 4 is stored in the memory of a ROM chip 76. By way of example, the following illustration depicts the procedure for determining the LSB representation shown on line 18.

ROM comparators choose the power output value 72 or 74 closest to 0.5. This output is selected for conversion using the table because it is the more sensitive to variations in V(t). The ambiquity which arises because V(t) is a double-valued function of the chosen output, Pi is resolved by determining whether the non-selected output power Pj is greater or less than 0.5. In this manner, V(t) can be determined uniquely within a range $\Delta$m. If the alternative value of P is greater than 0.5, it is assigned a bit value of 1 in the ROM memory; if it is less than 0.5, a bit value of zero is assigned. The ROM locates in its memory a unique binary number corresponding to the chosen Pi and the Pj value. This number is designated the LSB.

The means for determining the most significant bit MSB representation 22 consists of a third electronic analog-to-digital converter 20 driven directly by the voltage signal V(t). The ADCs 20, 68, and 70 may be any conventional type, such as, for example, Analog Devices Model CAV-1040.

The interleaving logic means 24 interleaves the MSB value on line 22 and LSB value on line 18 by selecting the value of k in Eq. 2.

$$V=k/2^{m-1}+[\cos^{-1}(2P-1)-\theta]\bmod 2\pi/2^m\pi,\quad K=0,1,2,\ldots 2^{m-1}-1 \qquad (2)$$

which will yield the value of V(t) closest to the MSB approximation. This is the final binary representation of the input voltage sample.

This step can be performed by storing the MSB value in the logic memory, sequentially selecting a K value in Eq. 2, determining V, and comparing V to the MSB approximation. For the present example, Toshiba gate array, model TC15G060 was used to perform the interleaving.

The application of this conversion algorithm is illustrated by an example, using an arbitrarily chosen value for the analog input voltage V(t) of 0.6987. Numerical values which appear in the conversion process are given in Table 1. Column (2) of that Table gives the analog values of the optical power for the two modulators 26 and 28 as calculated from Eq. (1). The electronic ADCs 68 and 70 then convert these quantities to the four-bit binary numbers given in Column (3). Decimal equivalents of the entries in Column (3) are given in Column (4) for reference purposes only. Since the $L_2$ output is closest in magnitude to 0.5, it is the one used in the ROM conversion. Column (5) gives the LSB value from the ROM table, as determined from the $L_2$ value of Column (3) and the fact that the $L_1$ value of Column (3) is also less than 0.5. The final value of V(t), determined by adding 5/8 to the entry in Column (5), is given in Column (6).

The value of 5 is chosen for the parameter k to give a final value closest to the MSB first approximation of 0.71875. The quantization error in this case is equal to 0.6994–0.6980=0.0007. Note that the ROM LSB value in Column (5) is expressed as a four-digit decimal number, which has a precision of approximately 14 binary bits. This illustrates the point that the ROM output values need not be limited to the precision of the electronic ADCs. In practice, the ROM outputs would have several more bits of precision than the inputs in order to minimize quantization errors.

Obviously, many modifications and variations of the present invention are possible in the light of the above teachings. It is therefore to be understood that within the scope of the appended claims, the invention may be practiced otherwise than as specifically described.

TABLE I

| (1) Modulator | (2) P(Vj), analog | P(Vj), (3) binary | quantized (4) decimal | LSB (5) Vj-k/8 | ADC output (6) Vj |
|---|---|---|---|---|---|
| $L_1$ | .0772 | 0001 | .09375 | | |
| $L_2$ | .2331 | 0011 | .28125 | .0744 | .6994 |

What is claimed and desired to be secured by Letters Patent of the United States is:

1. An optical analog-to-digital converter comprising:

an optical conversion unit including a first electro-optic modulator and a second electro-optic modulator formed from a single mode waveguide for generating optical modulator signal outputs, wherein said modulators are driven in parallel by an input analog signal V(t) and said optical modulator signal outputs are identical except for a relative phase bias $\theta$;

LSB means for detecting, digitizing, and processing the optical modulator signal outputs to form a least significant bits representation LSB of V(t);

MSB means for digitizing said input analog signal V(t) to form a most significant bits MSB representation; and means for interleaving said LSB representation and said MSB representation to form a final binary representation of said input analog signal V(t).

2. An optical analog-to-digital converter as claimed in claim 1, wherein said LSB digitizing means comprises a first electronic analog-to-digital converter to receive and convert the detected output from said first modulator to digital form, and a second electronic analog-to-digital converter to receive and convert the detected output from said second modulator to digital form.

3. An optical analog-to-digital converter as claimed in claim 1, wherein said LSB processing means comprises means to compare said digitized representations of the detected optical modulator signal outputs and to choose the digitized value closest to a designated reference value essentially in a predetermined midrange of possible analog-to-digital converter outputs.

4. An optical analog-to-digital converter as claimed in claim 1, wherein said MSB means comprises an electronic analog-to-digital converter fed directly by the input analog signal V(t).

5. An optical analog-to-digital converter as claimed in claim 1, wherein said interleaving means comprises binary logic gates.

6. An optical analog-to-digital converter as claimed in claim 1, wherein said single mode waveguide is formed in a substrate of lithium tantalate.

7. An optical analog-to-digital converter as claimed in claim 1, wherein said single mode waveguide is formed in a substrate of lithium niobate.

8. An optical analog-to-digital converter as claimed in claim 3, wherein said means to compare said digitized representations of the detected optical modulator signal outputs and to choose the digitized value closest to a designated reference value essentially in a predetermined midrange of possible analog-to-digital converter outputs comprises read only memory (ROM) logic.

9. An optical analog-to-digital converter comprising:

an optical conversion unit including two interferometric electro-optic modulators formed from single-mode waveguides in a single crystal substrate of a Pockels (linear) electro-optic material for generating optical modulator signal outputs, wherein said modulators are driven in parallel by an input analog signal and wherein said modulator optical signal outputs are identical except for a relative phase bias $\theta$;

a repetitively pulsed light source for sampling the optical output signals from said modulators;

a first photodetector to convert the transmitted optical signal from one of said modulators into electrical signals essentially proportional in voltage to the amplitude of the optical signals;

a second photodetector to convert the transmitted optical signal from the second modulator into electrical signals essentially proportional in voltage to the amplitude of the optical signals;

a first electronic analog-to-digital converter to digitize the signal detected by the first photodetector;

a second electronic analog-to-digital converter to digitize the signal detected by the second photodetector;

LSB means for forming a least significant bit LSB representation of the input analog signal from the outputs of said electronic analog to digital converters;

a third electronic analog-to-digital converter fed directly by the input analog signal to form a most significant bits MSB representation of the input analog signal; and an interleaving logic stage to form a final binary representation of said input analog signal V(t) by interleaving said least significant bits representation LSB and said most significant bits representation MSB.

10. An optical analog-to-digital converter as recited in claim 9, wherein said LSB means comprises read only memory (ROM) logic.

11. A method of converting input analog signals to digital form comprising:

modulating a first light beam in accordance with said input analog signals to yield a first optical output signal, and modulating a second light beam with said input analog signals to yield a second optical output signal with a phase bias of $\theta$ relative to said first output signal;

forming an optical conversion unit having a first electro-optic modulator and a second electro-optic modulator on a single crystal substrate of a pockels (linear) electro-optic material, said modulators are driven in parallel by an input analog signal, and said modulator optical output signals are identical except for a relative phase bias $\theta$;

sampling the optical transmissions of said first and second optical output signals;

forming a least significant bits LSB representation of the modulator optical output signals;

digitizing said input analog signals to form a most significant bits MSB representation; and interleaving said least significant bits LSB value and said most significant bits MSB value to form a final binary representation of said input analog signal.

12. A method of converting input analog signals to digital form, as recited in claim 11, wherein the sampling step is performed by a mode locked laser.

13. A method of converting input analog signals to digital form, as recited in claim 11, wherein forming a least significant bits representation comprises:

digitizing the optical output of said electro-optic modulators; and comparing said digitized optical output and to choose the output value closest to a designated reference value essentially in a predetermined midrange of possible analog-to-digital converter outputs.

14. A method of converting input analog signals to digital form, as recited in claim 13, wherein the digitizing step is performed by, a first electronic analog-to-digital converter serially connected to the output of said first modulator, and a second electronic analog-to-digital converter serially connected to the output of said second modulator.

15. A method of converting input analog signals to digital form, as recited in claim 13, wherein said comparing step is performed by read only memory (ROM) logic.

16. A method of converting input analog signals to digital form, as recited in claim 11, wherein said interleaving step is performed by binary logic gates.

* * * * *